United States Patent
Wang et al.

[19]

[11] Patent Number: 6,166,556

[45] Date of Patent: Dec. 26, 2000

[54] METHOD FOR TESTING A SEMICONDUCTOR DEVICE AND SEMICONDUCTOR DEVICE TESTED THEREBY

[75] Inventors: James Wang, Berlin, Germany; James L. Rutledge, Austin, Tex.; Kenneth Kaskoun, Berlin, Germany

[73] Assignee: Motorola, Inc., Schaumburg, Ill.

[21] Appl. No.: 09/086,072

[22] Filed: May 28, 1998

[51] Int. Cl.[7] .......................... G01R 31/26; G01R 31/02
[52] U.S. Cl. ........................... 324/765; 324/754
[58] Field of Search .................... 324/754, 755, 324/757, 765

[56] References Cited

U.S. PATENT DOCUMENTS

| | | | |
|---|---|---|---|
| 5,007,163 | 4/1991 | Pope et al. | 29/840 |
| 5,065,227 | 11/1991 | Frankeny et al. | 357/74 |
| 5,374,893 | 12/1994 | Koopman et al. | 324/754 |
| 5,447,264 | 9/1995 | Koopman et al. | 228/563 |
| 5,554,940 | 9/1996 | Hubacher | 324/765 |
| 5,574,386 | 11/1996 | Beaumont et al. | 324/765 |

*Primary Examiner*—Safet Metjahic
*Assistant Examiner*—Russell M. Kobert
*Attorney, Agent, or Firm*—Lanny L. Parker

[57] ABSTRACT

A test substrate (30) including a plurality of solder bumps (38) is used to test a die (10) which can be used as either a wire-bonded device or a flip-chip device. Die (10) includes test pads (14) which are redundant electrical connections to bond pads (12). The solder bumps make contact with the test pads of the device during testing. On separating the test substrate and die, the bumps remain on the test substrate if the die is to be wire bonded, or are transferred to the die if the die is to be flip-chip mounted to a next-level package substrate. Whether the bumps are transferred or not is determined by the relative areas of the solder receiving pads/studs (26 and 36) on the test substrate die. Common process flows and even die layouts can be used for the two different device types, thereby saving manufacturing and design costs.

5 Claims, 3 Drawing Sheets

//6,166,556

METHOD FOR TESTING A SEMICONDUCTOR DEVICE AND SEMICONDUCTOR DEVICE TESTED THEREBY

FIELD OF THE INVENTION

The present invention relates generally to semiconductor device testing methods, and more particularly to a common method for testing both wire-bonded and flip-chip bonded semiconductor devices.

BACKGROUND OF THE INVENTION

While solder bumps are increasingly becoming a common means of electrically connecting a semiconductor die to its next level substrate in a flip-chip configuration, wire bonded semiconductor devices remain the most common form of products sold in the semiconductor industry. For purposes of lowering costs, it would be advantageous if a semiconductor manufacturer could use as many common manufacturing operations for the two types of devices as possible.

One area of manufacturing where the process flow of the two types of devices tends to diverge is testing. Wire-bonded devices are usually tested much differently than their flip-chip counterparts. Wire bonded devices are typically burned-in and functionally tested after the die has been fully packaged (e.g. after the die has been wire bonded to leads of a lead frame and encapsulated in a plastic or ceramic package body). The external package leads are used to make the necessary electrical connections for testing. With bumped die to be flip-chip mounted directly onto the board, an external package is not used. For example, a bumped die may be sold directly to a customer for direct chip attach (DCA) to the customer's printed circuit board. In this situation, the semiconductor manufacturer must test the die without the luxury of having a leaded package.

One method of testing at the die level is to use probe needles or pins which make physical and electrical contact with input/output (I/O) and power pads of the device, usually while the die are still in wafer form. However, probing is difficult once the device has been bumped. Not only is contact between the bumps and needles difficult to make, but damage to the bumps is possible. Probe needles cannot practically be used during high-temperature testing (e.g. at burn-in) because the needles tend to move too much, losing electrical connection to the bumps or pads during the test. Furthermore, burn-in requires long test time where utilizing expensive testers is not practical.

Another wafer-level testing method is to form a sacrificial conductive layer, such as copper, over the device and to use this conductive layer to test the device, for example as described in U.S. Pat. No. 5,399,505 by Dasse et al. A disadvantage of this technique is that as the wafer becomes larger and as device geometry pitches become smaller, it is difficult to establish routing connections to those die near the center of the wafer. One method of guaranteeing access to the center of the wafer is to employ multiple sacrificial conductive layers to route signals, but this significantly adds to the manufacturing cost of the wafer.

Another approach for testing unpackaged die is the use of test sockets which are specially designed for use with bare die. The primary disadvantages of this method are the high cost of each socket, and thus the test board cost, handling of bare die, and the complications associated with loading and unloading each socket on the board. Furthermore, such test sockets cannot be used to test devices at the wafer level thereby eliminating the ability to supply product in wafer form.

U.S. Pat. No. 5,447,264 by Koopman et al. discloses a method for testing bare die which uses a temporary testing substrate that also serves to transfer solder bumps to the device tested. Solder is electroplated through a via opening in a passivation layer of the temporary substrate, and into an etched trench underlying the via. The solder also extends onto the passivation layer adjacent to the via. The plated solder "islands" are then aligned to, and brought into physical contact with, the I/O pads of a semiconductor die. The composite structure is then heated and cooled to form a solid phase mechanical and electrical connection between the semiconductor device and the temporary substrate. Testing is performed, then a shearing or pulling force is applied between the device and the temporary substrate to cause the solder bump to fracture at the temporary substrate, leaving the solder on the I/O pads of the device. While the method disclosed in U.S. Pat. No. 5,447,264 has several advantages over the other mentioned prior art techniques for testing at the die or wafer level, the method is limited to use die which are to be bumped (i.e. flip-chip die).

Accordingly, a need exists for a method for testing semiconductor devices which is conducive to use with both flip-chip die or wire-bonded die designs so that manufacturing flows of the two devices can be kept as common as possible. Ideally, such a method would be performed at the die or wafer level to prevent unnecessarily packaging non-functional or weak devices and would impose minimal cost to the manufacturing operation. It is also desirable for such a method to enable a common die design for the two different device types.

DETAILED DESCRIPTION OF A PREFERRED EMBODIMENT

Figure 1:
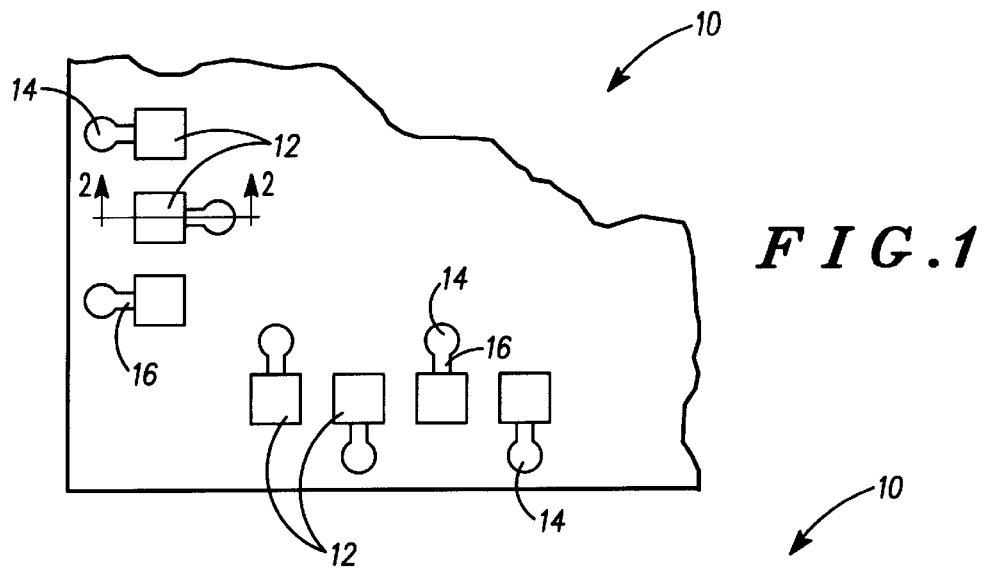
FIG. 1 is a top-down view of a portion of a semiconductor die intended to be wire-bonded which can be tested in the same manner as a flip-chip or bumped semiconductor die, in accordance with one embodiment of the present invention.

Generally, the present invention provides a method for testing a semiconductor device which is intended to be wire bonded in the same manner in which flip-chip or bumped semiconductor die are tested. As such, the process flows for the two different types of devices can be kept similar throughout manufacturing. Preferably, testing is performed at the die or wafer level. Each die is designed to include the bond pads for wire bonding. In addition, a dedicated test pad is included in the design for each bond pad. The test pads are electrically connected to the bond pads and are formed of a solder wettable material. A test substrate having a plurality of solder bumps formed thereon is brought into contact with the device to be tested. The solder bumps of the test substrate form an electrical and physical connection with the test pads of the device. The device is tested, using the test substrate and solder bumps as the means to send signals to the device's integrated circuitry. The solder bumps are then heated to a liquidus state and the test substrate is separated from the device, whereby the solder bumps remain on the test substrate, leaving only a trace amount of solder on the test pads of the device. The volume of solder transferred to the device is minimal because the test pads on the device are designed to be smaller in area than the solder bump pads on the test substrate. This small volume of solder on test pads does not interfere with subsequent a wire bonding process.

A similar method can be used to test flip-chip or bumped die. Rather than forming both bond pads and tests pads, a flip-chip die design would include only a solder receiving pad, preferably formed in accordance with the same process used to form the test pads for the wire bonded device but using different masks to pattern the layers. A test substrate is brought adjacent the device such that the solder bumps on the test substrate make contact with the solder receiving pads of the device. After testing, the test substrate is separated from the device, but in this instance the solder bumps are transferred onto the device because the solder receiving pads on the device are designed to be larger in area than the solder bump pads on the test substrate. Due to the fact that the solder receiving pads for a flip-chip device are larger than the test pads on the wire-bonded device, different mask to pattern the pads are needed. However, as an alternative to altering the pad size on the device, the size of the solder receiving pads/studs on the test substrate can be changed. With this latter approach, the die design can be the same for flip-chip and wire bonded devices. Two different test substrates would be used to test the two device types; one which has pads designed to cause the solder bumps to transfer to the device after testing and one which has pads designed to cause the solder bumps to remain on the test substrate after testing.

With the invention, a test substrate including a plurality of solder bumps can be used to test both devices (wire bonded devices and devices to be bumped or flip-chip bonded). Depending on the designs of each device, the solder bump footprint for the test substrate may be different for the two devices. However, the manufacturing flow through the production line is much the same. Common die designs can also be used for flip-chip and wire bonded devices. Therefore, with the invention manufacturing costs can be reduced while still offering two different product types to customers.

These and other features, and advantages, will be more clearly understood from the following detailed description taken in conjunction with FIGS. 1–7. It is important to point out that the illustrations may not necessarily be drawn to scale, and that there may be other embodiments of the present invention which are not specifically illustrated. It is also noted that like reference numerals may be used to designate identical or corresponding parts throughout the several views.

FIG. 1 is a top-down view of a portion of a semiconductor die 10 in accordance with the present invention. As shown, die 10 includes a plurality of bond pads 12 for receiving wire bonds. Die 10 also includes a test pad 14 associated with each bond pad 12, and electrically connected thereto by an interconnecting portion 16. The bond pads, and thus the test pads, are electrically coupled to integrated circuitry (not shown) which is formed on the die in accordance with conventional practice. The particular functionality or design of the integrated circuitry, and the manner in which it is connect to the bond pads, are not important for purposes of understanding the present invention and thus will not be described in further detail. While FIG. 1 illustrates that every bond pad of the die has an associated test pad, this is not a requirement of the invention. Only those bond pads which would otherwise be accessed for testing need to include test pads. As an example, several of the bond pads may be used to provide power to the device, yet only a few of these may be needed during testing.

As illustrated, bond pads 12 are located around the periphery of die 10. While this pattern is not a requirement of the invention, wire bonding is usually performed on peripheral bond pads to facilitate bonding to leads (e.g. leads of a lead frame or traces on a ceramic package body or organic substrate), which surround the die periphery. As also illustrated, test pads 14 are arranged on opposing sides of adjacent bond pads. Again, this is not a requirement of the present invention but it facilitates a closer bond pad pitch, and thus reduces the size of die 10, as further explained below.

Figure 2:
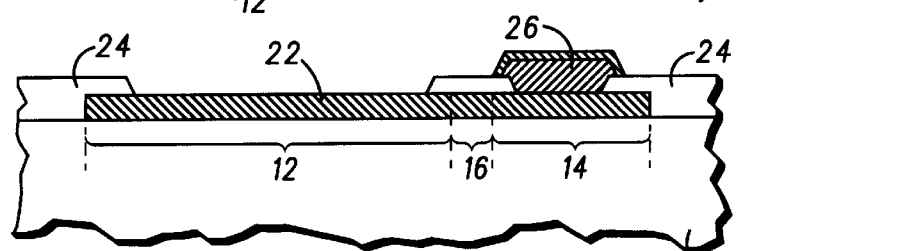
FIG. 2 is a cross-section view of a portion of the semiconductor device of FIG. 1, taken along the line 2—2.

FIG. 2 is a cross-sectional view of die 10 taken through line 2—2 of FIG. 1. Die 10 includes a semiconductor substrate 20. Although substrate 20 is illustrated as being a single unitary element, those familiar with the area of semiconductor manufacturing will understand that the substrate is likely to include a number of conductive and insulating layers deposited and patterned over a semiconductor material (e.g. silicon) to form transistors, resistors, capacitors, or other active or passive elements included as part of the integrated circuitry. However, these underlying layers are not important for purposes of understanding the present invention, and furthermore are well understood in the art, and thus are not described in further detail.

As shown in FIG. 2, a conductive layer 22 is formed over substrate 20. Conductive layer 22 forms the bond pad 12, test pad 14 and interconnecting portions 16 of die 10 as indicated. Formation of these elements is accomplished by depositing a blanket layer of conductive material on substrate 20 and patterning it using conventional lithographic and etch processes. Conductive layer 22 is electrically connected to an appropriate portion(s) of the integrated circuitry (not shown). Conductive layer 22 is preferably formed of the same metallurgy used for metal layers in known semiconductor manufacturing, such as aluminum (which may be doped with silicon and/or copper). The uppermost layer of substrate 20, on which conductive layer 22 is deposited, is predominately insulative to isolate the pads from one another after patterning. However, the conductive layer 22 must be coupled to the underlying integrated circuitry, and therefore layer 22 will be deposited also on some conductive portions (e.g. conductive plugs).

Formed over conductive layer 22 is a passivation layer 24. Passivation layer 24 can be formed of any conventional passivation materials, including silicon nitride (SiN), silicon dioxide (SiO2), polyimide, or the like. The passivation layer is patterned using traditional lithographic and etching techniques to expose bond pad portion 12 and test pad portion 14 of conductive layer 22 as shown in FIG. 2. The exposed portion of bond pad 12 will eventually receive a wire bond, as subsequently explained. The exposed portion of the test pad 14 is further processed to form a solder receiving stud 26, as explained below.

Solder receiving stud 26 is formed of a material which is wettable by solder, and preferably is formed by electroless plating of nickel and gold in the case where conductive layer 22 is formed of aluminum. To form stud 26 by electroless plating, for example, a patterned resist mask is formed over conductive layer 22 and passivation layer 24 such that an opening in the mask corresponds in location to the opening in passivation layer 24 overlying test pad 14. The die (which is preferably in wafer form at this stage) is then immersed in an electroless nickel plating bath, whereby nickel (Ni) is deposited selectively within the resist mask opening over test pad 14. Preferably the nickel is deposited to a thickness of about 5–10 micrometers ($\mu$m) and extends above passivation layer 24 to make easier connection to solder bumps of the test substrate, as explained below. A flash deposition of gold (Au) is used to coat the nickel stud and serves as an anti-oxidant. The two layers shown in FIG. 2 for stud 26 represent the nickel and gold layers, however, the present invention is not restricted to the particular metallurgies or deposition process disclosed herein. All that is required is that the stud of the test pad be formed of a conductive material which is wettable by solder. After forming the stud, the resist mask is then removed, resulting in the structure shown in FIG. 2.

Figure 3:
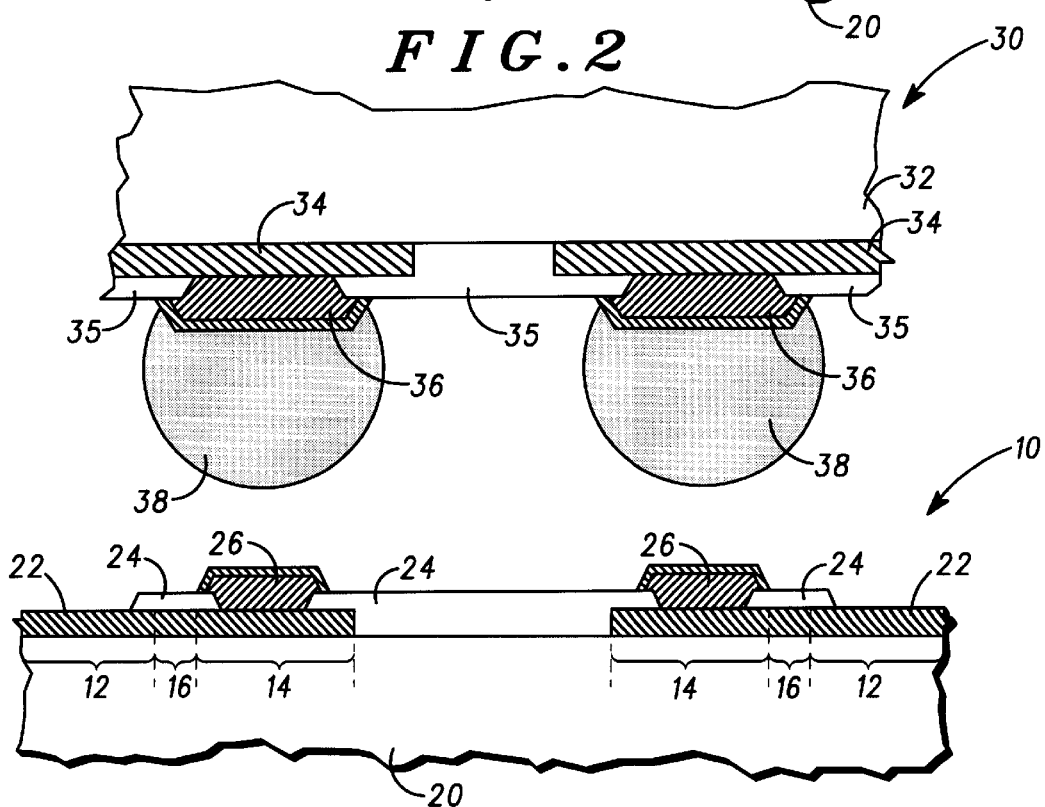
FIGS. 3–6 are a series of cross-sectional illustrations demonstrating a method for testing the semiconductor device of FIG. 1, also in accordance with the present invention.

Once the test pad has been prepared for receiving a solder bump (e.g. by forming stud 26 thereon), the device may be tested in accordance with the present invention, as demonstrated by FIGS. 3–6. FIG. 3 illustrates a portion of die 10 in a cross-sectional view. In this view, only two different test pad portions 14, bond pad portions 12, interconnecting portions 16, and studs 26 are shown for simplicity, but one will realize that these features will exist for each bond pad/test pad combination on die 10. Also included in FIG. 3 is a test substrate 30. Test substrate 30 includes an underlying substrate material 32, on which a conductive layer 34 is formed. A passivation layer 35 is formed over conductive layer 34 and is patterned to expose a portion of conductive layer 34 corresponding in location to the location of solder receiving studs 26 of die 10. As with substrate 20 of die 10, substrate material 32 of test substrate 30 is illustrated as a single unitary element but in practice may be a composite of various conductive and insulative layers, depending on how complex the test circuitry needed to test die 10 is. In its most simple form, conductive layer 34 is deposited and patterned on either a glass substrate or on a semiconductor substrate which has on oxide layer formed thereon. Glass or semiconductor substrate materials are preferred because the coefficient of thermal expansion (CTE) can be made to closely match that of die 10. In more complex designs, conductive layer 34 may be one of multiple conductive layers, separated by insulating materials, to establish the necessary electrical routing. Since the manufacture and design of the layers which make up substrate material 32 is not particularly important for purposes of understanding the present invention, further details are omitted.

Conductive layer 34 is likewise preferably formed of aluminum, and passivation layer 35 can be any one of several known passivation layer materials. Conductive layer 34 is patterned to provide electrical routing from a tester's I/O and power pads or pins to the I/O and power pads (e.g. test pads) of die 10. The preferred metallurgies of stud 36 are the same as those for studs 26, electroless plated Ni—Au if conductive layer 34 is aluminum. These elements can be formed in the same manner as described above, with the exception that the studs 36 are made to be larger in area than the corresponding studs 26 of die 10. This is achieved simply by making the openings in passivation layer 35 larger to expose more area of conductive layer 34, on which the studs are plated. The purpose of making studs 36 larger than studs 26 is to enable solder bumps 38 to remain on studs 36, rather than studs 26, upon separation after testing as explained further below.

Solder bumps 38 are formed on studs 36 of test substrate 30 using a conventional solder deposition technique. A preferred technique is to screen print the solder onto studs 36 for cost effectiveness reasons; however, plating and evaporative deposition of the solder can also be used. In a preferred embodiment, solder bumps 38 are formed of lead-tin (Pb—Sn) solder, but other solder compositions are not precluded by the invention.

Figure 4:
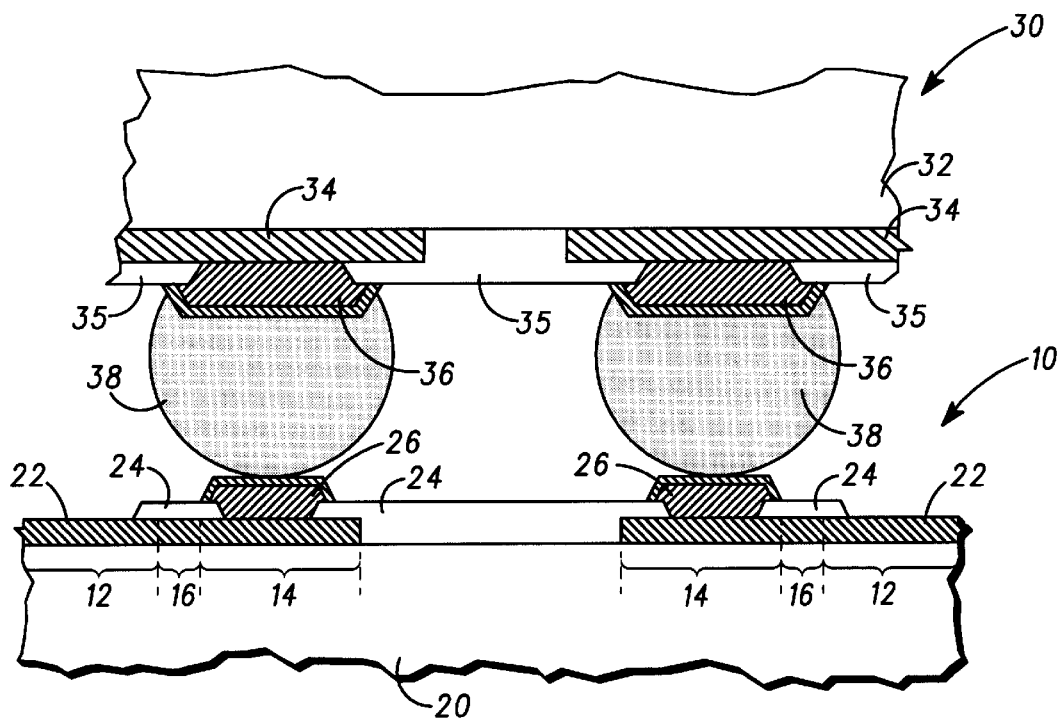
Figure 5:
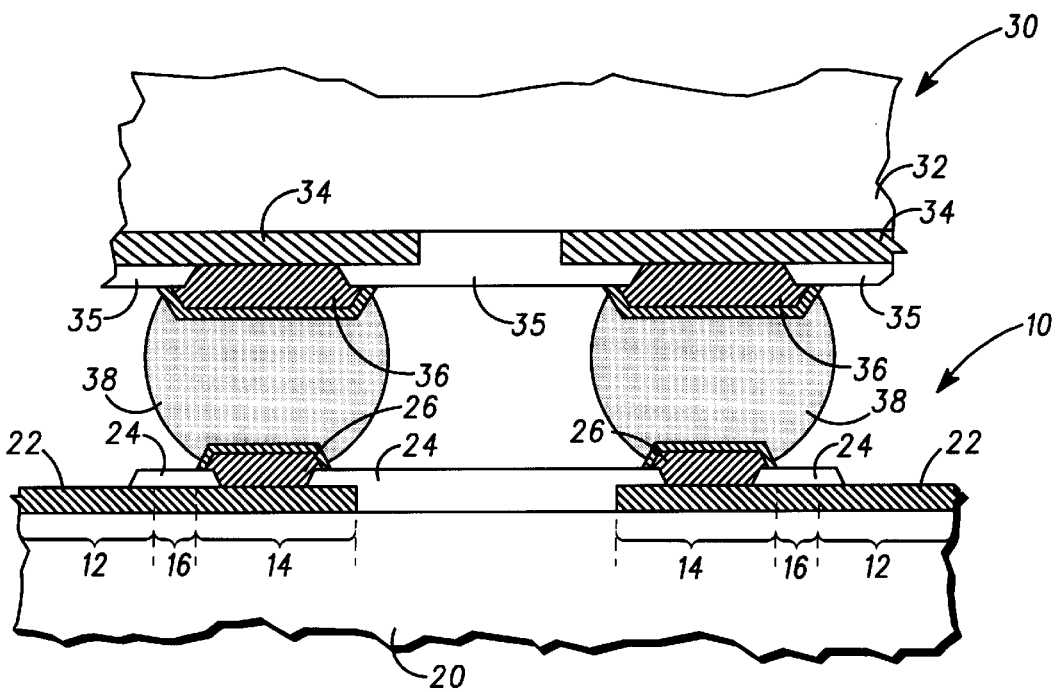

To perform the testing, test substrate 30 is aligned with die 10 such that solder bumps 38 align with studs 26 of die 10, as shown in FIG. 3. Then, the test substrate and die are brought together so that the solder bumps touch the studs, as shown in FIG. 4. For assuring adequate electrical connection between the solder bumps and the studs, heat is applied to cause the solder to change from a solid phase to a liquidus phase, whereby the solder will wet studs 26 as shown in FIG. 5. Alternatively, the solder can already be in a liquidus state upon making contact with the studs. Upon cooling, a solid phase mechanical connection is made such that the test substrate 30 and die 10 are joined, with the solder bumps 38 providing a physical and electrical connection to both studs 26 and 36. The device can now be tested by providing test signals to the device via test substrate 30. Testing can be in the form of burn-in testing, functional testing, etc., depending on the semiconductor manufacturer's particular requirements.

Figure 6:
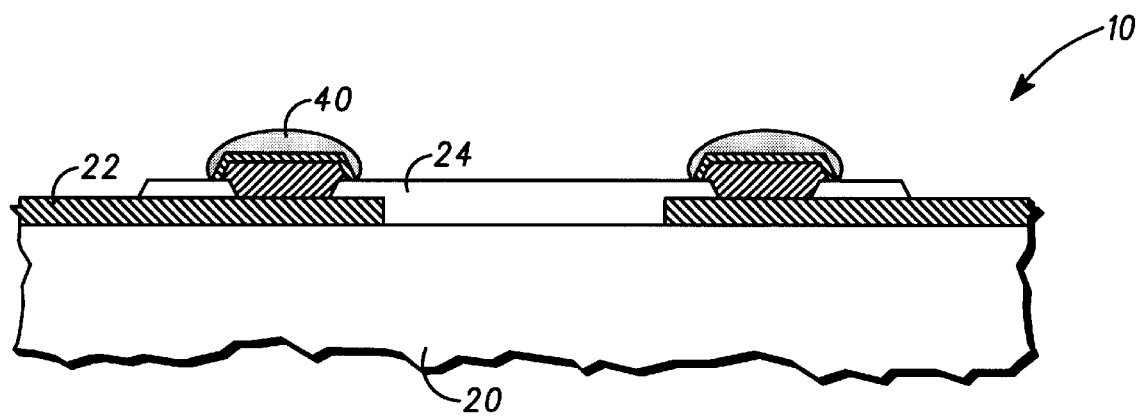

Following testing, the test substrate 30 is separated from die 10, preferably by again heating the structure to cause the solder to change to its liquidus state. Upon separating, solder bumps 38 will remain on studs 36 as opposed to studs 26 due to the difference in surface area of the two studs in the example illustrated. The particular size of studs 36 and 26 will be dependent upon the size of the solder bumps formed on studs 36. As an example, a suitable stud diameter for studs 26 will be about 50–60 micrometers ($\mu$m), if using a solder bump with a diameter of 125 $\mu$m, resulting in a suitable stud area for studs 26 of about 2000–3000 $\mu$m2. For the same size solder bump, a diameter of 100–120 $\mu$m is suitable for studs 36, for an area of 8000–11000 $\mu$m2. Upon separating, a trace, residual amount of solder 40 will remain on studs 26 of die 10, as shown in FIG. 6. However, this amount (e.g. usually less than 2 $\mu$m thick, and preferably less than 1 $\mu$m thick) will not adversely affect die 10 and can be left in place.

The above noted dimensions are suitable for use where solder bumps 38 remain on test substrate 30. If, however, die 10 is to be used as a flip-chip device, the relative pad sizes should be reversed. In other words, the large pads should be formed on the die and the smaller pads on the test substrate.

Furthermore, as an alternative testing method for wire-bonded device, the solder bumps could initially be formed on the semiconductor die 10, with subsequent transfer to test substrate 30. However, this method is less cost effective and involves more complex processing. One would have to form bumps on studs on the die which are smaller than usual (so that the bumps could later be transferred to larger studs on the test substrate). Additionally, the bumps would have to be removed from the test substrate for further use. Also, unsuccessful bumping of the die may result in scrapping an entire die or wafer.

Figure 7:
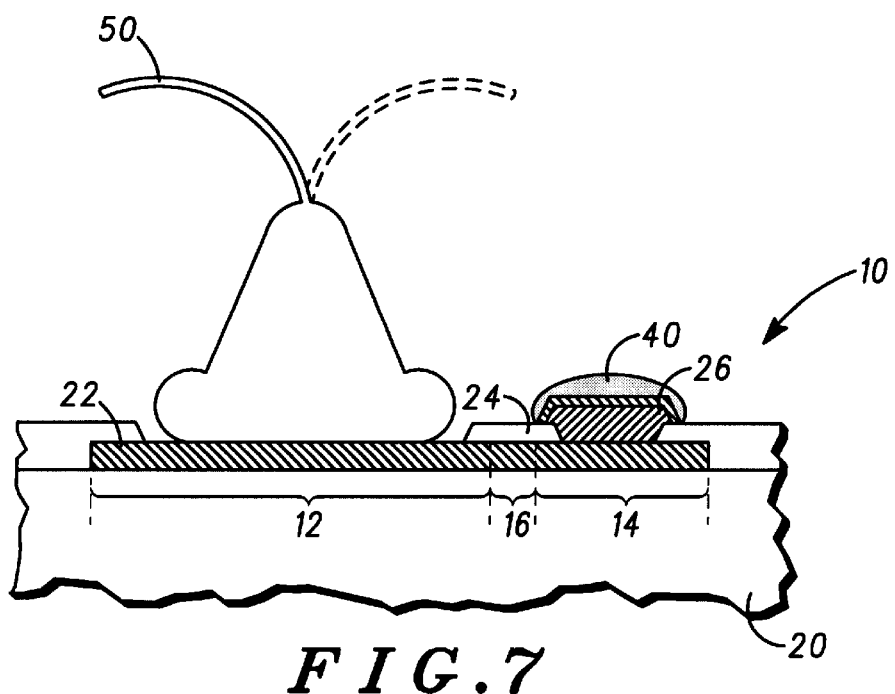
FIG. 7 illustrates, from the cross-sectional view of FIG. 2, the manner in which the semiconductor device can be wire bonded to a next-level packaging substrate after testing.

After separation from test substrate 30, die 10 is ready to be wire bonded or flip-chip mounted in accordance with conventional practice. For example with a wire-bonded device, the die are singulated from the wafer (if in wafer form at the time of test) and are die bonded to a lead frame or pre-formed package base. Electrical connection to leads of a lead frame or the traces formed on the package base are made by conventional wire bonding. For example, as shown in FIG. 7, a wire bond 50 is bonded to bond pad portion 12 of conductive layer 22. After bonding, the die may be encapsulated for protection from the environment, either by a plastic molding compound, resin die coat, or pre-formed package cap (not shown).

The test pad portion 14 of conductive layer 22 may be on any side of the bond pad portion 12, thus it is possible that the wire bond will span over stud 26 and residual solder 40, as indicated by the broken lines in FIG. 7. As briefly mentioned above, in a preferred form the test pads and corresponding studs are formed on opposing sides of adjacent bond pads, as shown in FIG. 1. In this case, the wire bonds would span over the studs and residual solder at every other bond location. The purpose of this staggered arrangement is to enable the smallest pad pitch, and therefore the smallest die area, as possible. A typical pad pitch (center-to-center spacing) for bond pads 14, which are typically 50–70 μm wide by 100–150 μm long) is 70–100 μm, whereas the pitch for solder receiving studs 26 is about 200 μm for receiving a 125 μm solder bump. Accordingly, the solder receiving studs are preferably farther apart from one another than the bond pads. It is noted that the solder studs do not have to have the mentioned pitch; however, it is easier to work with larger pitches and would allow for higher yields, less accurate equipment, and therefore inexpensive assembly, and quicker throughput.

The semiconductor die and testing method described above enable the same type of device testing to be used for wire-bonded die as well as bumped die. In using test substrate 30 for testing a die to be bumped, the differences are as follows. For a die to be bumped, only one pad needs to be defined for conductive layer 22, namely that area on which a stud will be formed. There is no need for a distinct wire bond area and a test pad area. The exposed pad will serve both as the test connection and the final I/O or power connection of the die. Also, the stud which is formed on the die should be made larger in area than the corresponding stud on the test substrate, such that upon separating the test substrate from the die, the solder is transferred from the test substrate to the die. Thus the testing substrate serves the dual purpose of testing and solder bump transfer. The testing substrates can then be re-bumped and used again for testing and/or solder transfer. While the design of the die and test substrate may be slightly different depending upon which of the two types is being tested, the process flow through the product line is the same through testing. Accordingly, redundancies in differing types of test equipment and floor space can be eliminated. However, a common die design between the wire bonded device and the flip-chip device is possible when the test substrate solder receiving pad/stud design is made different. Common die designs further reduce costs by way of eliminating or consolidating design resources and mask inventory. Another advantage is that the present invention provides a means of testing wire bonded devices at the wafer level to avoid unnecessarily packaging bad die, for additional cost savings.

Thus it is apparent that there has been provided, in accordance with the invention, a method for testing semiconductor devices, and a semiconductor device tested thereby, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to the particular metallurgies herein mentioned. Rather than aluminum, the conductive layers of the die and/or test substrate can be copper. Similarly, the studs could be made of copper, in which case it is preferred that the studs be plated on a titanium tungsten (TiW) seed layer and be capped with nickel to avoid copper diffusion in Pb—Sn solder. Furthermore, the invention is not limited to the particular deposition techniques for either the stud metallurgies or solder bump formation. It is also important to note that the present invention is not limited in any way to redundant test pad location relative to the wire bond pad location. For example, the test pads could be located entirely within the saw streets or scribe grids on the wafer to perhaps further reduce the final die size. In addition the invention is not limited to use in conjunction with wire-bonded devices, but can also be extended to use with tape automated bonding (TAB) devices. Furthermore, the invention is not limited to the particular packaging used to finally package a wire or TAB bonded or flip-chip device. For example, molded plastics packages, glob-top packages, organic ball grid array packages, ceramic packages, or any other next-level package substrate can be used. Therefore, it is intended that this invention encompass all such variations and modifications as fall within the scope of the appended claims.

What is claimed is:

1. A method for testing integrated circuitry of a semiconductor device comprising the steps of:

providing a semiconductor die having integrated circuitry coupled to a bond pad and a test pad formed on a surface of the semiconductor die that are electrically connected to each other;

providing a test substrate having a solder bump for making electrical and physical connection to the test pad of the semiconductor die;

bringing the solder bump on the test substrate in contact with the test pad on the semiconductor die;

testing the integrated circuitry of the semiconductor die by transmitting electrical signals thereto via the solder bump of the test substrate in contact with the test pad;

separating the test substrate from the semiconductor die while the solder bump is in a liquidus state; and attaching a wire bond to the bond pad for electrically accessing the integrated circuitry.

2. The method of claim 1 wherein the step of providing a semiconductor die comprises providing a semiconductor die in wafer form.

3. The method of claim 1 wherein the step of testing comprising functional testing the integrated circuitry.

4. The method of claim 1 wherein the step of testing comprising burn-in testing the integrated circuitry.

5. The method of claim 1 wherein test pads of the semiconductor die are staggered on opposite sides of the bond pads around a periphery of the semiconductor die.

* * * * *